US010998358B2

(12) United States Patent
Choi

(10) Patent No.: US 10,998,358 B2
(45) Date of Patent: May 4, 2021

(54) IMAGE SENSOR INCLUDING DUMMY ISOLATION STRUCTURE

(71) Applicant: Samsung Electronics Co., Ltd., Suwon-si (KR)

(72) Inventor: Min-jun Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 3 days.

(21) Appl. No.: 16/382,651

(22) Filed: Apr. 12, 2019

(65) Prior Publication Data

US 2020/0119067 A1 Apr. 16, 2020

(30) Foreign Application Priority Data

Oct. 12, 2018 (KR) ........................ 10-2018-0121588

(51) Int. Cl.
*H04N 5/341* (2011.01)
*H01L 27/146* (2006.01)

(52) U.S. Cl.
CPC .. *H01L 27/14609* (2013.01); *H01L 27/14605* (2013.01); *H04N 5/341* (2013.01)

(58) Field of Classification Search
CPC ......... H01L 27/14609; H01L 27/14605; H01L 27/1463; H01L 27/14607; H01L 27/1464; H01L 27/14643; H04N 5/341
See application file for complete search history.

(56) References Cited

U.S. PATENT DOCUMENTS

| | | | |
|---|---|---|---|
| 9,754,987 | B2 | 9/2017 | Lee |
| 9,832,399 | B2 | 11/2017 | Wei et al. |
| 9,911,777 | B2 | 3/2018 | Lee et al. |
| 2018/0175091 | A1 | 6/2018 | Jeon et al. |
| 2018/0184333 | A1 | 6/2018 | Cordeiro |
| 2018/0197904 | A1 | 7/2018 | Oh et al. |
| 2018/0182808 | A1 | 8/2018 | Kim et al. |

FOREIGN PATENT DOCUMENTS

| | | |
|---|---|---|
| JP | 2012-084816 A | 4/2012 |

*Primary Examiner* — Twyler L Haskins
*Assistant Examiner* — Angel L Garces-Rivera
(74) *Attorney, Agent, or Firm* — Harness, Dickey & Pierce, P.L.C.

(57) ABSTRACT

An imaging device may include regions of active pixels, which are included in the generation of a photoelectric signal, and dummy pixels, which are not included in the generation of a photoelectric signal. Electrical characteristics of the dummy pixels may affect the photoelectric signal produced by the active pixels unless isolation is provided to reduce the electrical conductivity therebetween. An image sensor includes a substrate including an active pixel region and a dummy pixel region, a pixel isolation structure at least partially penetrating the substrate and configured to reduce electrical conductivity between an active pixel in the active pixel region and a dummy pixel in the dummy pixel region, and a dummy isolation structure at least partially penetrating the substrate of the dummy pixel region.

20 Claims, 11 Drawing Sheets

A
105
II'
I'
102
103
PIS
ACT1
ACT2
FD
TG
AP
APR
DPR
II
I
DPR2
DIS
122
123
140
DPR1
DPR2
DP
D1
D2
D3

150
CF
CF
136
134
132
100b
100
103
102
PIS
107
100a
111a
113
111b
111c
110
I'
TG
105
PD
FD
PD
FD
115
AD
DD1
AP
AP
APR
DP
DP
DP
DPR1
140
123
122
DIS
I
D3
D1
D2

136
134
132
100b
100
103
102
PIS
107
100a
111a
113
111b
111c
110
II'
150
CF
CF
PD
PD
105
TG
FD
FD
115
AD
DD2
AP
AP
APR
DP
DP
DP
DPR2
II
D1
D2
D3

A
105
102
103
PIS
ACT1
ACT2
FD
TG
AP
APR
DPR
DPR2
122
123
DISa
140
DPR1
DPR2
DP
D1
D2
D3

150
CF
CF
136
134
132
100b
100
103
102
PIS
107
100a
111a
113
111b
111c
110
PD
PD
FD
FD
105
TG
115
AD
DD3
DISb
122
123
140
AP
AP
APR
DP
DP
DP
DPR1
III'
III
D1
D2
D3

A
105
102
103
PIS
ACT1
ACT2
FD
TG
AP
APR
DPR
DPR2
DIS
122
123
DPR1
140
DISb
DP
D1
D2
D3

IMAGE SENSOR INCLUDING DUMMY ISOLATION STRUCTURE

CROSS-REFERENCE TO RELATED APPLICATION

This application claims priority under 35 U.S.C. § 119 to Korean Patent Application No. 10-2018-0121588, filed on Oct. 12, 2018, in the Korean Intellectual Property Office, the disclosure of which is hereby incorporated by reference in its entirety.

Technical Field

Example embodiments of the present disclosure relate to image sensors and methods of manufacturing image sensors.

Discussion of Related Art

An image sensor is a semiconductor device for converting an optical image into an electrical signal. With development of computer and communication industries, there are strong demands for high performance image sensors in various devices, for example, a digital camera, a camcorder, a personal communication system (PCS), a game device, a security camera, a medical micro camera.

SUMMARY

According to example embodiments of the inventive concepts, an image sensor may include a substrate including an active pixel region and a dummy pixel region, a pixel isolation structure configured to at least partially penetrate the substrate, wherein the pixel isolation structure is configured to reduce electrical conductivity between an active pixel in the active pixel region and a dummy pixel in the dummy pixel region.

According to example embodiments of the inventive concepts, an image sensor may include an active pixel region including an active pixel, a dummy pixel region including a dummy pixel, a second dummy pixel region, and a dummy isolation structure that is configured to reduce electrical conductivity between the dummy pixel and the second dummy pixel region.

According to example embodiments of the inventive concepts, an image sensor may include a substrate including at least two pixel regions including an active pixel region and a dummy pixel region, and a pixel isolation structure in the substrate that is configured to reduce electrical conductivity between the at least two pixel regions and having a lattice shape.

DETAILED DESCRIPTION

Figure 1:
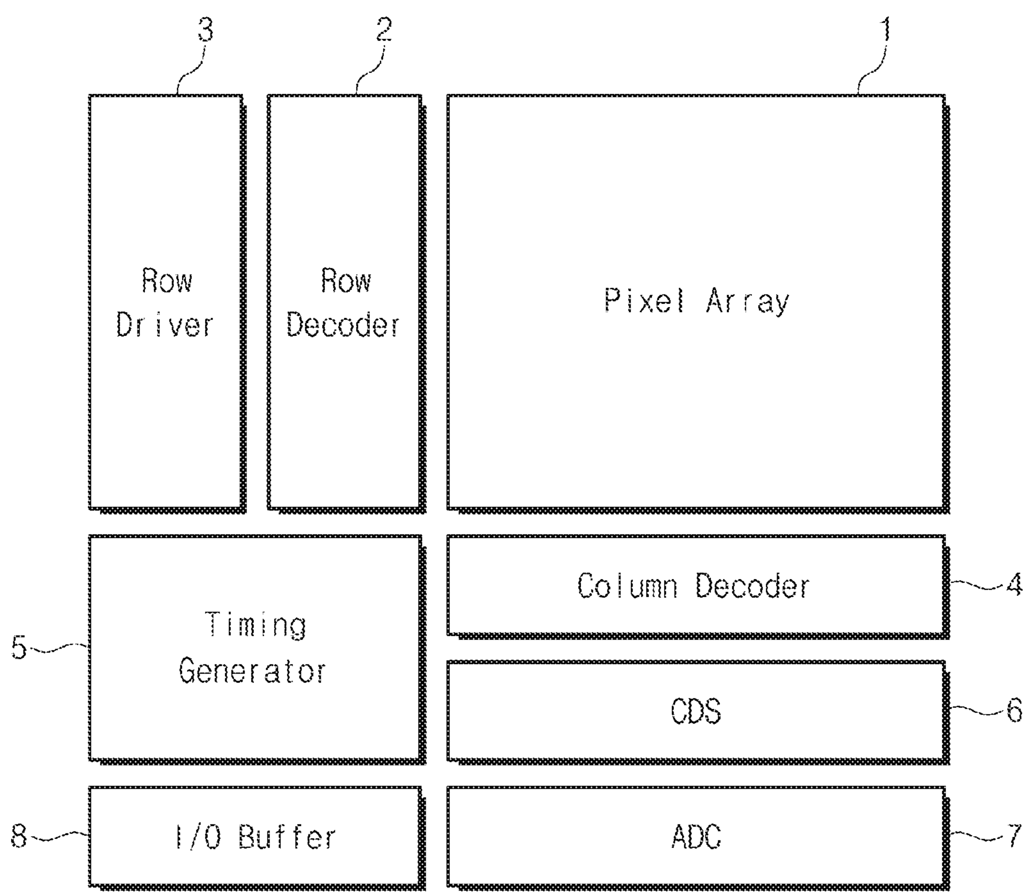
FIG. 1 is a block diagram of an image sensor according to example embodiments.

Various example embodiments will now be described more fully hereinafter with reference to the accompanying drawings. Like reference numerals may refer to like elements throughout this application.

Some imaging devices are designed to generate images based on input from a pixel array. The generation may include processing such as a comparison of digital signals with background noise, such as electrical current. Such comparisons may include a comparison of active pixels and dummy pixels, where dummy pixels are structurally similar to active pixels but are not included in the generating a photoelectric signal. It may be desirable to provide electrical insulation between various regions of active pixels and dummy pixels to reduce electrical current that may otherwise arise therebetween and alter the performance of the imaging device.

FIG. 1 is a block diagram of an image sensor according to an example embodiment of the techniques presented herein.

Referring to FIG. 1, an image sensor according to example embodiments may include a pixel array 1, a row decoder 2, a row driver 3, a column decoder 4, a timing generator 5, a correlated double sampler (CDS) 6, an analog-to-digital converter (ADC) 7, and/or an input/output buffer 8.

The pixel array 1 may include a plurality of unit pixels arranged in rows and/or columns and may convert lights incident on the unit pixels into electrical signals.

The pixel array 1 may be driven by a plurality of driving signals, such as a selection signal, a reset signal, and/or a charge transfer signal provided from the row decoder 2.

The row decoder 2 may provide drive signals to the unit pixels in each row. In addition, an electrical signal converted in the pixel array 1 in response to the drive signals may be provided to the correlated double sampler 6.

The row driver 3 may provide a plurality of drive signals for driving the plurality of unit pixels to the pixel array 1 depending on the results decoded by the row decoder 2. When the unit pixels are arranged in rows and/or columns, the drive signals may be provided to the unit pixels in each row.

The timing generator 5 may control the row and/or column decoders 2 and 4, the correlated double sampler 6, the analog-to-digital converter 7 and/or the input/output buffer 8 and may provide control signals, such as a clock signal, a timing control signal, etc., for operations thereof. The timing generator 5 may include a logic control circuit, a phase lock loop circuit, a timing control circuit, a communication interface circuit, etc.

The correlated double sampler 6 may hold and sample by receiving output signals generated from the pixel array 1. For example, the correlated double sampler 6 may double-sample a signal level by a certain noise level and/or an electrical signal to output a difference level corresponding to difference between the noise level and the signal level.

The analog-to-digital convertor 7 may convert an analog signal corresponding to the difference level output from the correlated double sampler 6 into a digital signal and may output the digital signal.

The input/output buffer 8 may latch the digital signal output from the analog-to-digital convertor 7. The latched signal may sequentially output the digital signal to an image signal processing unit in accordance with the results decoded by the column decoder 4.

Figure 2:
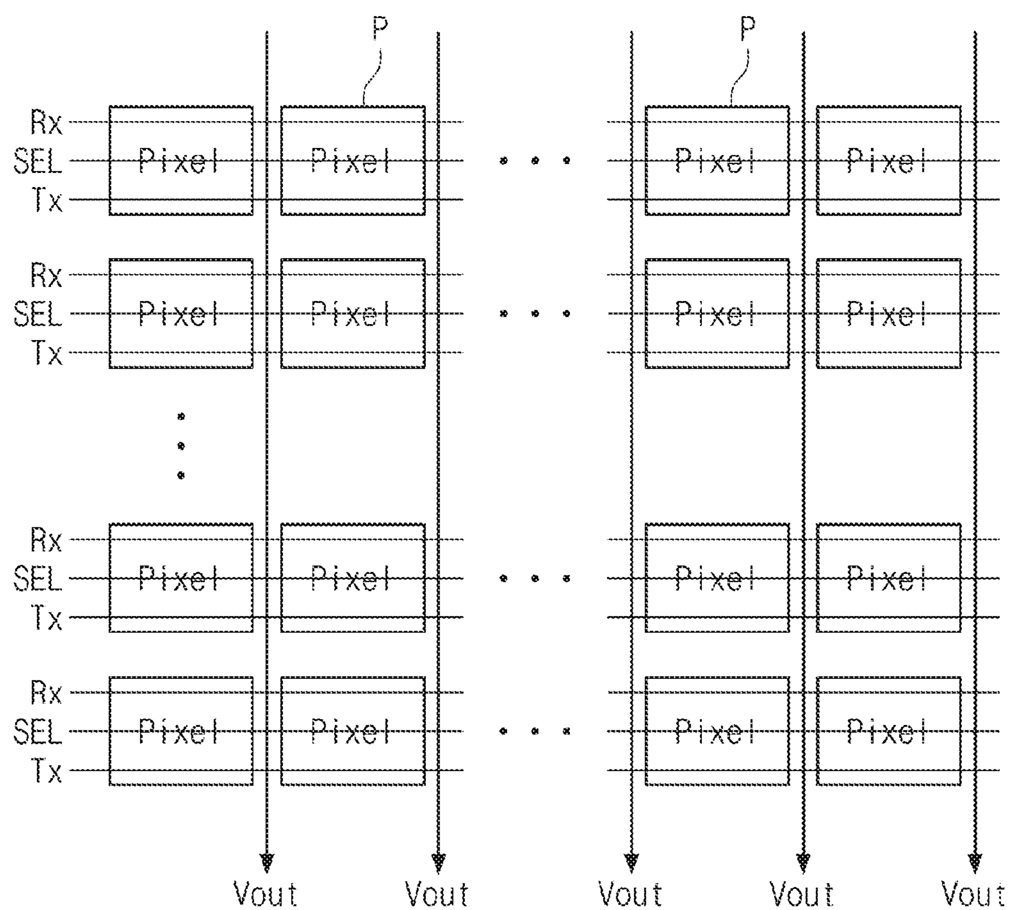
FIG. 2 is a schematic circuit diagram of a pixel array of an image sensor according to example embodiments.

FIG. 2 is a schematic circuit diagram of a pixel array of an image sensor according to example embodiments.

Referring to FIG. 2, the pixel array 1 may include a plurality of pixel regions P arranged two-dimensionally along rows and/or columns. An electrical signal may be generated in each of the pixel regions P by incident light. The pixel regions P may be driven by the drive signal transferred through a pixel select line SEL, a charge transfer line Tx, and/or a reset line Rx connected to the pixel regions P. The converted electrical signal in the pixel regions P may be provided to a control circuit through an output line Vout.

Figure 3:
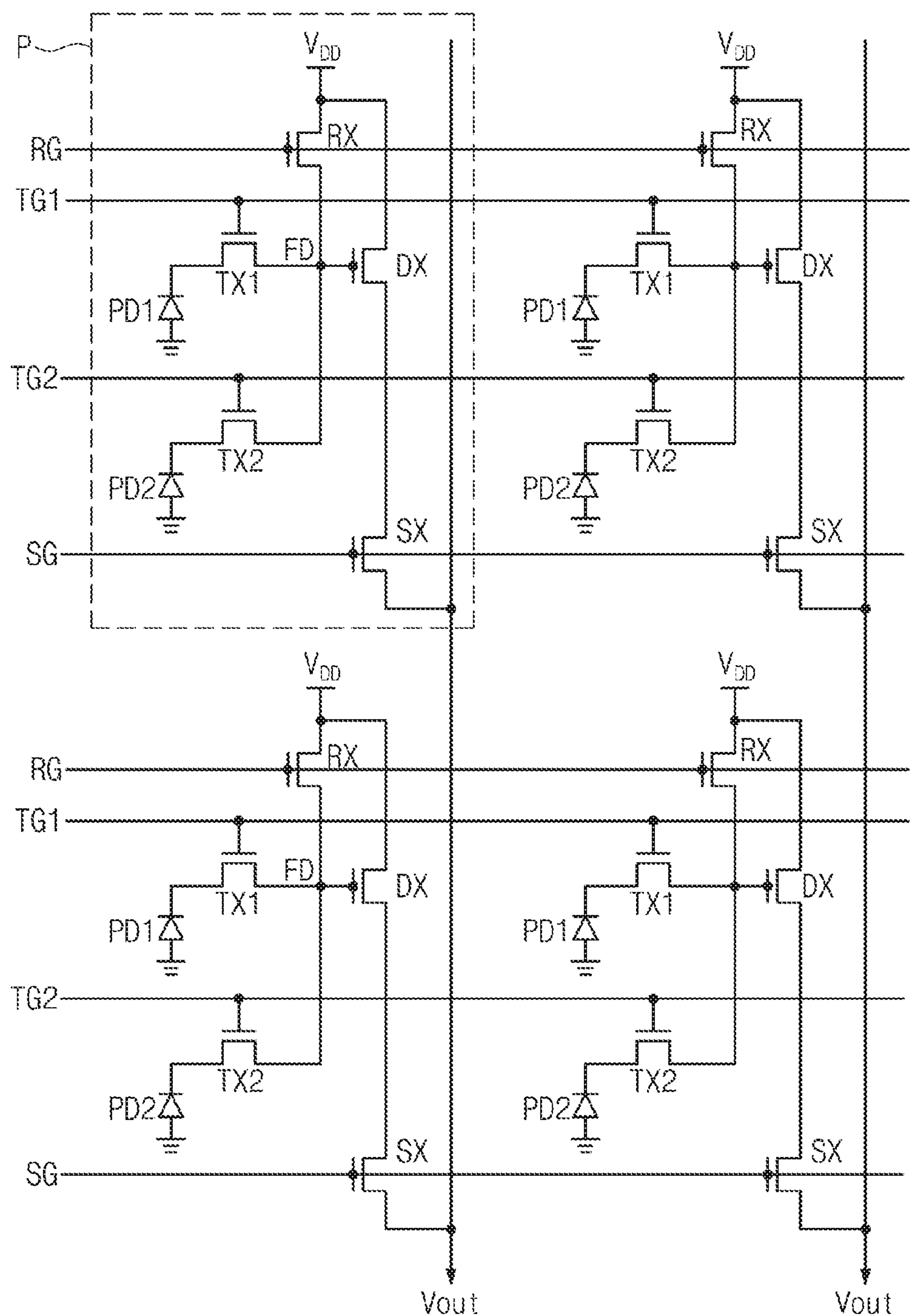
FIG. 3 is a circuit diagram of a pixel array of an image sensor according to example embodiments.

FIG. 3 is a circuit diagram of a pixel array of an image sensor according to example embodiments.

Referring to FIG. 3, the pixel array 1 may include a plurality of pixel regions P and may be arranged in a matrix form along a row direction and/or a column direction. The pixel regions P may include a first photoelectric conversion element PD1 and a second photoelectric conversion element PD2, transfer transistors TX1 and TX2, and/or logic transistors RX, SX, and DX. The logic transistors RX, SX, and DX may include a reset transistor RX, a selection transistor SX, and/or a drive transistor (or a source follower transistor) DX. Gate electrodes of the first and second transistors TX1 and TX2, the reset transistor RX, and/or the selection transistor SX may be respectively connected to drive signal lines TG1, TG2, RG, and SG.

The first transfer transistor TX1 may include a first transfer gate TG1 and the first photoelectric conversion element PD1. The second transfer transistor TX2 may include a second transfer gate TG2 and the second photoelectric conversion element PD2. The first and second transfer transistors TX1 and TX2 may share a charge detection node (i.e., a floating diffusion region) FD.

The first and second photoelectric conversion elements PD1 and PD2 may generate and accumulate photoelectric charges in proportion to an amount of light incident from the outside. The first and second photoelectric conversion elements PD1 and PD2 may each include a photo diode, a photo transistor, a photo gate, a pinned photo diode, or a combination thereof.

The first and second transfer gates TG1 and TG2 may transfer the charges accumulated in the first and second photoelectric conversion elements PD1 and PD2 to the charge detection node FD. Complementary signals may be applied to the first and second transfer gates TG1 and TG2. In other words, the charges may be transferred from any of the first and second photoelectric conversion elements PD1 and PD2 to the charge detection node FD.

The charge detection node FD may receive the charges generated from the first and second photoelectric conversion regions PD1 and PD2 and may cumulatively store the charges. The drive transistor DX may be controlled depending on an amount of the charges accumulated in the charge detection node FD.

The reset transistor RX may periodically reset the charges accumulated in the charge detection node FD. A drain electrode of the reset transistor RX may be connected to the charge detection node FD, and a source electrode of the reset transistor RX may be connected to a power source voltage VDD. When the reset transistor RX is turned on, the power source voltage VDD connected to the source electrode of the reset transistor RX may be transferred to the charge detection node FD. Thus, when the reset transistor RX is turned on, the charges accumulated in the charge detection node FD may be discharged, such that the charge detection node FD may be reset.

The drive transistor DX may be combined with a constant current source located outside the pixel regions P to act as a source follower buffer amplifier, such that the drive transistor DX may amplify a potential variation value at the charge detection node FD and may output the amplified value to the output line Vout.

The selection transistor SX may select the pixel regions P to be read on row-by-row basis. When the selection transistor SX is turned on, the power source voltage VDD connected to the drain electrode of the drive transistor DX may be transferred to a drain electrode of the selection transistor SX.

Figure 4:
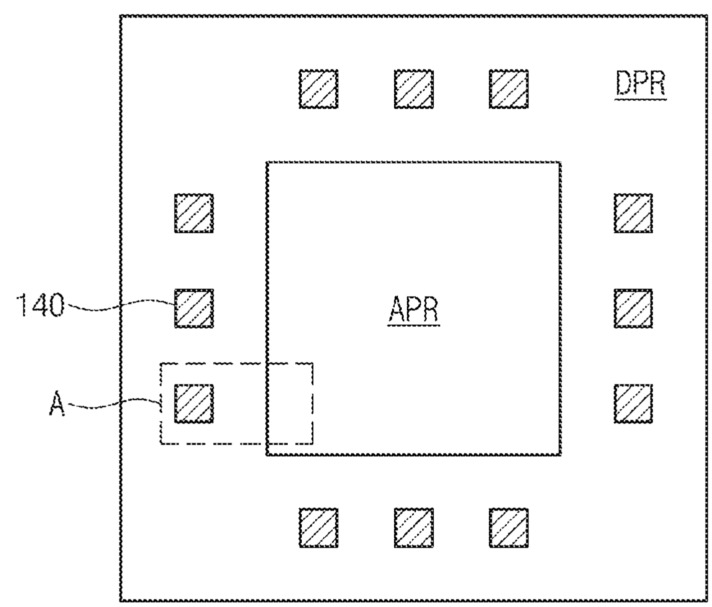
FIG. 4 is a plan view of an image sensor according to example embodiments.

FIG. 4 is a plan view of an image sensor according to example embodiments. An example of portion A of FIG. 4 is discussed in more detail in the context of FIG. 5A.

Referring to FIG. 4, an image sensor 10 may include an active pixel region APR and a dummy pixel region DPR. In plan view, the active pixel region APR may be located in a central region of the image sensor 10, and the dummy pixel region DPR may be located in a peripheral region of the image sensor 10. The dummy pixel region DPR may surround the active pixel region APR. The active pixel region APR may be a region in which active pixels may be located. The dummy pixel region DPR may be a region in which dummy pixels may be located. The active pixels may correspond to the pixel regions P described with reference to FIGS. 2 and 3. Each of the dummy pixels may have a structure similar to each of the active pixels, but may not perform an operation (i.e., an operation of receiving light and generating a photoelectric signal) similar to an operation of each of the active pixels. In example embodiments, the image sensor 10 may include a peripheral region in which a peripheral circuit may be located.

Figure 5A:
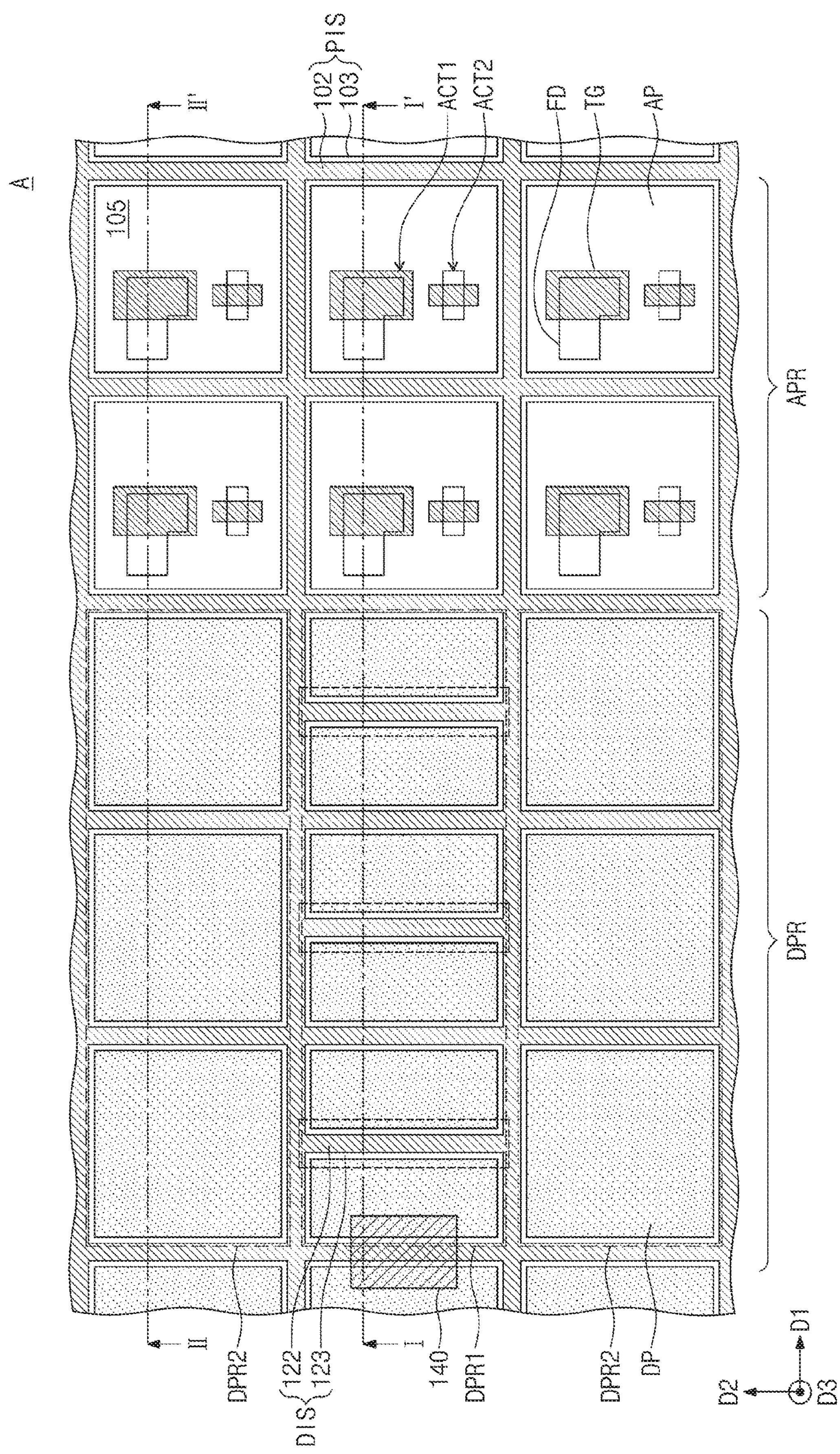
FIG. 5A is an enlarged view of portion A of FIG. 4.
Figure 5B:
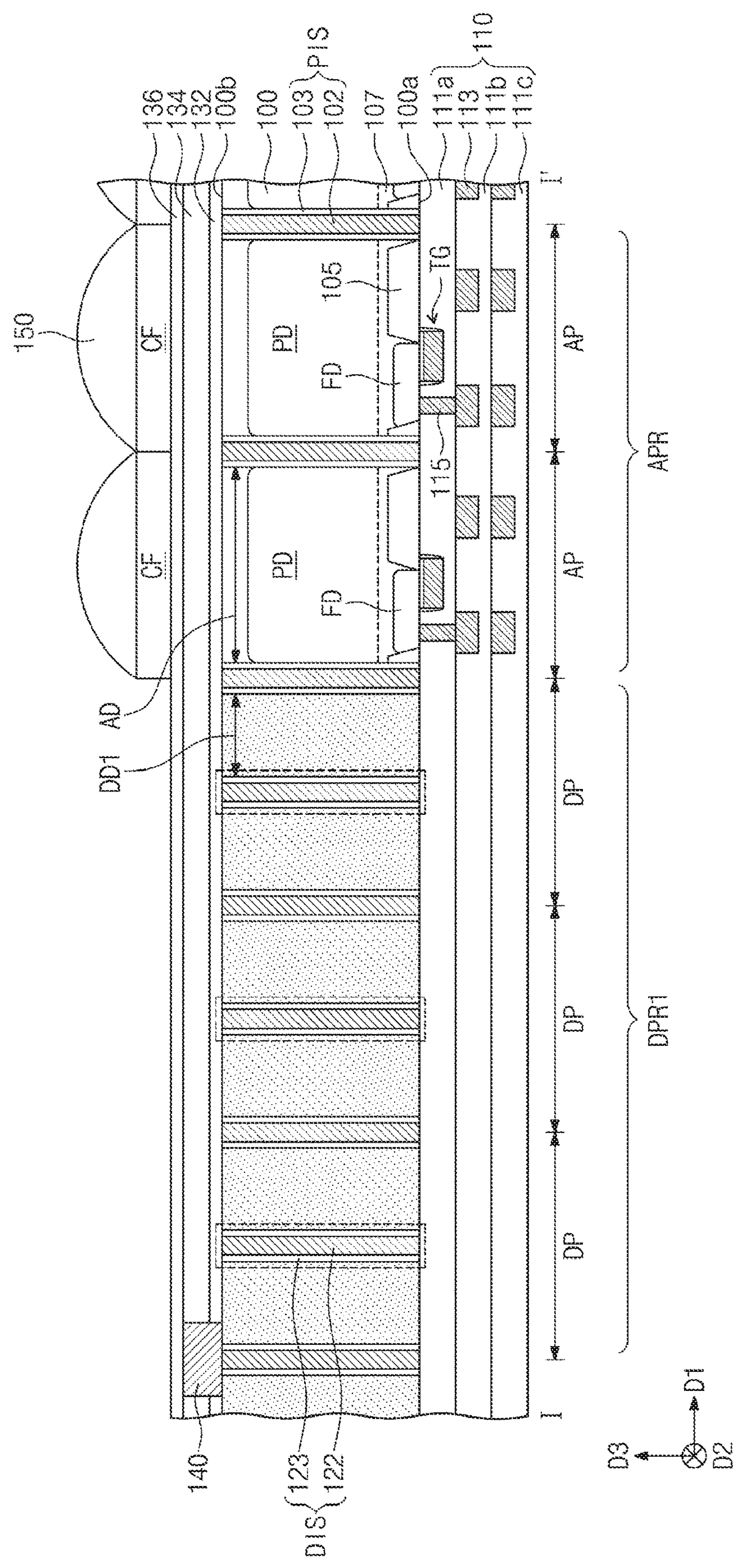
FIG. 5B is a cross-sectional view taken along line I-I' of FIG. 5A.
Figure 5C:
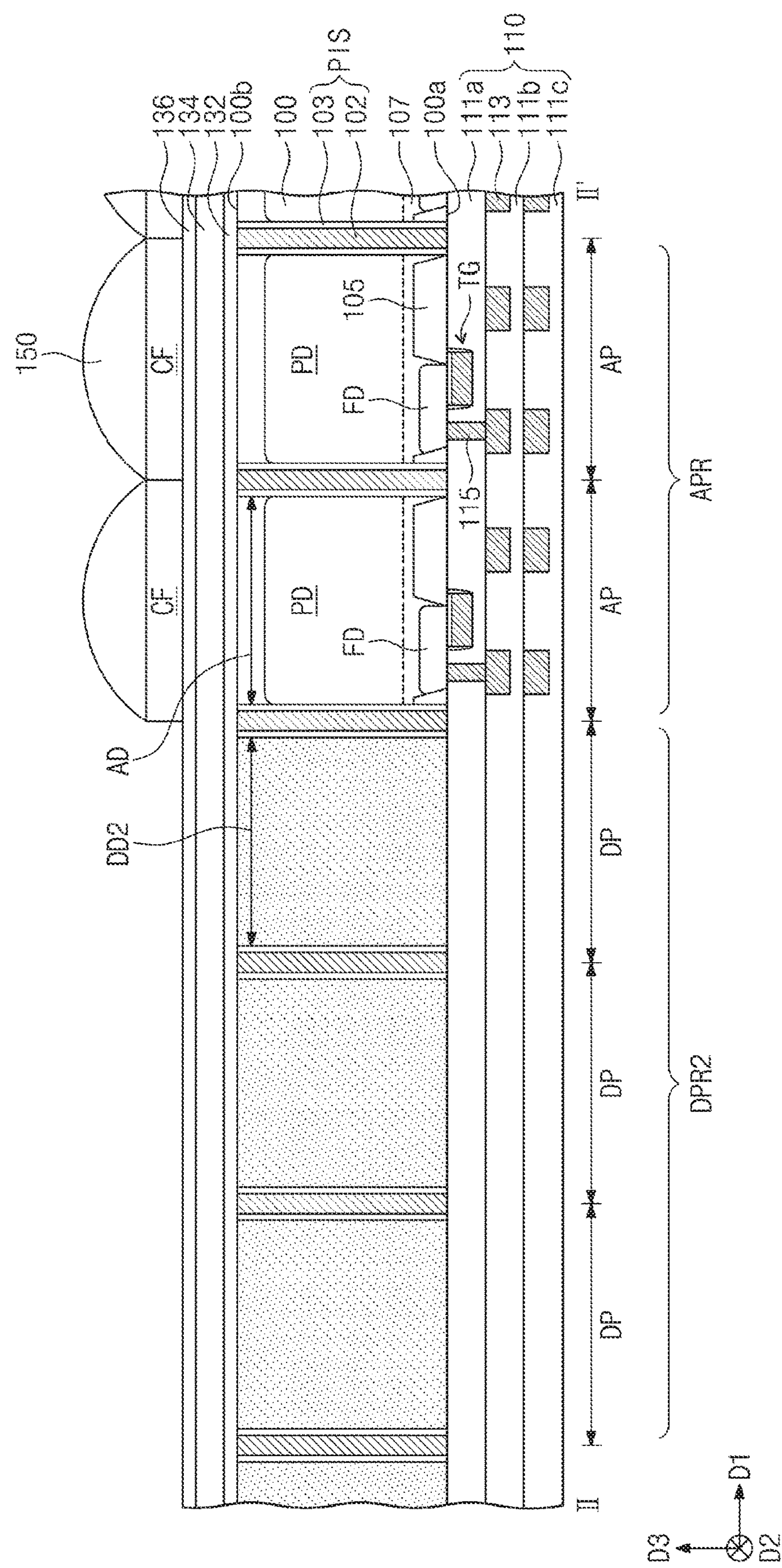
FIG. 5C is a cross-sectional view taken along line II-II' of FIG. 5A.

FIGS. 5A to 5C are views of an image sensor according to example embodiments. FIG. 5A is an enlarged view of portion A of FIG. 4. FIG. 5B is a cross-sectional view taken along line I-I' of FIG. 5A. FIG. 5C is a cross-sectional view taken along line II-II' of FIG. 5A.

Referring to FIGS. 5A to 5C, the image sensor 10 may include a substrate 100. The substrate 100 may have a first surface 100*a* and a second surface 100*b* that are opposite to each other. In example embodiments, the first surface 100*a* may be a front surface of the substrate 100, and the second surface 100*b* may be a back surface of the substrate 100. Circuits may be located on the first surface 100*a* of the substrate 100. The light may be incident on the second surface 100*b* of the substrate 100. In example embodiments, the substrate 100 may be a silicon substrate doped with a first conductivity type impurity, such as an n-type impurity. In example embodiments, the substrate 100 may be one of a germanium substrate, a silicon-germanium substrate, a group II-V compound semiconductor substrate, a group III-V compound semiconductor substrate, and/or a silicon on insulator (SOI) substrate. In example embodiments, a first conductivity type impurity concentration in the substrate 100 may be decreased in a direction from the first surface 100*a* to the second surface 100*b*.

The substrate 100 may include the active pixel region APR and the dummy pixel region DPR. The active pixel region APR may be one region of the substrate 100, and the dummy pixel region DPR may be another region of the substrate 100.

Active pixels AP may be provided in the active pixel region APR. The active pixels AP may correspond to the unit pixel regions P described with reference to FIGS. 2 and 3. Dummy pixels DP may be provided in the dummy pixel region DPR. The dummy pixels DP may each have a structure as the same as or similar to that of each of the active pixels AP, but may not perform an operation (i.e., an operation of receiving light and generating a photoelectric signal) similar to an operation of each of the active pixels AP.

A pixel isolation structure PIS may be located in the substrate 100 and may be configured to reduce electrical conductivity between a plurality of unit pixel regions AP and DP arranged in a matrix form along the first direction D1 and the second direction D2. The unit pixel regions AP and DP may refer to a region including all of a region in which the active pixels AP are located and a region in which the dummy pixels DP are located. In plan view, the pixel isolation structure PIS may surround each of the unit pixel regions AP and DP. In example embodiments, the pixel isolation structure PIS may include first sections extending parallel along the first direction D1 and second sections interesting the first sections and extending parallel along the second direction D2. In plan view, the pixel isolation structure PIS may have a lattice shape.

The pixel isolation structure PIS may be configured to at least partially penetrate the substrate 100. The pixel isolation structure PIS may vertically extend from the first surface 100*a* of the substrate 100 to the second surface 100*b* of the substrate 100. A vertical thickness of the pixel isolation structure PIS may be substantially the same as a vertical thickness of the substrate 100. The pixel isolation structure PIS may include a deep trench isolation (DTI) in the substrate 100. The pixel isolation structure PIS may include a front-side deep trench isolation (FDTI) by etching the substrate 100 from the first surface 100*a* of the substrate 100 to the second surface 100*b* of the substrate 100 and depositing materials.

The pixel isolation structure PIS may include a first insulation layer 103 and a first conductor 102 on the first insulation layer 103. In example embodiments, the first insulation layer 103 may include an electrically insulating material, such as silicon oxide, silicon nitride, air, or a combination thereof. In example embodiments, the first conductor 102 may include an electrically conductive material, such as polysilicon, metal silicide, a metal-containing layer, or a combination thereof. After a trench defining a shape of the pixel isolation structure PIS is created, the first insulation layer 103 may be created along an inner surface of the trench, and the first conductor 102 may be created to fill the trench having the first insulation layer 103.

The dummy pixel region DPR may include a first dummy pixel region DPR1 and a second dummy pixel region DPR2. The first dummy pixel region DPR1 may be a region between a conductive contact 140 and the active pixel region APR. The second dummy pixel region DPR2 may be a remaining region of the dummy pixel region DPR other than the first dummy pixel region DPR1.

The conductive contact 140 may be electrically connected to an external wiring line and may apply a negative voltage to the pixel isolation structure PIS. The conductive contact 140 may be connected to the first conductor 102 of the pixel isolation structure PIS. When the negative voltage is applied through the conductive contact 140, holes in the substrate 100 may move toward an interface of the pixel isolation structure PIS and may be accumulated therein. Thus, a dark current generation in the image sensor may be reduced. The conductive contact 140 may be provided on the second surface 100*b* of the substrate 100 as shown in the figure. In example embodiments, the conductive contact 140 may be provided on the first surface 100*a* of the substrate 100.

A plurality of dummy pixels DP may be provided in the first dummy pixel region DPR1. The first dummy pixel region DPR1 may include a plurality of adjacent dummy pixels DP. In example embodiments, the first dummy pixel region DPR1 may include three dummy pixels DP as shown in the figure. However, the number of the dummy pixels may not be limited thereto.

In example embodiments, the first dummy pixel region DPR1 includes a dummy isolation structure DIS. The dummy isolation structure DIS may be located in the substrate 100 of the first dummy pixel region DPR1. The dummy isolation structure DIS may be in the dummy pixels DP in plan view and may separate the dummy pixel into at least two sections. Referring to FIG. 5A, the dummy isolation structure DIS may have a linear shape extending in the second direction D2. However, the direction and the shape of the dummy isolation structure DIS may not be limited thereto.

In example embodiments, the dummy isolation structure DIS may be configured to at least partially penetrate the substrate 100. The dummy isolation structure DIS may vertically extend from the first surface 100*a* of the substrate 100 to the second surface 100*b* of the substrate 100. A vertical thickness of the dummy isolation structure DIS may be substantially the same as the vertical thickness of the substrate 100. The dummy isolation structure DIS may include a deep trench isolation (DTI) in the substrate 100. The dummy isolation structure DIS may include a front-side deep trench isolation (FDTI) etched in the substrate 100 from the first surface 100*a* of the substrate 100 to the second surface 100*b* of the substrate 100 and/or depositing materials.

In example embodiments, the dummy isolation structure DIS may include a second insulation layer 123 and a second conductor 122 on the second insulation layer 123. In example embodiments, the second insulation layer 123 may include an electrically insulating material, such as silicon oxide, silicon nitride, air, or a combination thereof. In example embodiments, the second conductor 122 may include an electrically conductive material, such as polysilicon, metal silicide, a metal-containing layer, or a combination thereof. After a trench defining the dummy isolation structure DIS is created, the second insulation layer 123 may be created along an inner surface of the trench, and the second conductor 122 may be created to fill the trench having the second insulation layer 123.

In example embodiments, the dummy isolation structure DIS may have the same structure and/or material as the pixel isolation structure PIS described above. In example embodiments, the dummy isolation structure DIS is connected to the pixel isolation structure PIS. In example embodiments, the dummy isolation structure DIS is integrally coupled to the pixel isolation structure PIS. In some example embodiments, the dummy isolation structure DIS may be a portion of the pixel isolation structure PIS.

In example embodiments, the dummy isolation structure DIS is not provided in the second dummy pixel region DPR2. In example embodiments, the conductive contact 140 is not provided in the second dummy pixel region DPR2.

Referring to FIGS. 5B and 5C, since the dummy isolation structure DIS is provided in the dummy pixel DP in the first dummy pixel region DPR, a distance DD1 between and the dummy isolation structure DIS and the pixel isolation structure PIS adjacent thereto in the first dummy pixel region DPR1 may be smaller than a distance AD between adjacent pixel isolation structures PIS in the active pixel region APR. In example embodiments, the distance DD1 between adjacent pixel isolation structures PIS in the first dummy pixel region DPR1 may be smaller than the distance AD between the adjacent pixel isolation structures PIS in the active pixel region APR. A distance DD2 between adjacent pixel isolation structures PIS in the second dummy pixel region DPR2 may be the same as the distance AD between the adjacent pixel isolation structures PIS in the active pixel region APR. The distance AD between the adjacent pixel isolation structure PIS may substantially correspond to a width of each the unit pixels AP and DP. Since the unit pixels AP and DP may have a similar size and/or shape, the distance between the pixel isolation structures PIS in a region (i.e., the first dummy pixel region DPR1) in which the dummy isolation structure DIS is provided may be relatively small.

To suppress the dark current generation, a negative voltage may be applied to the dummy pixel region DPR through the conductive contact 140. Thus, there may be need for isolation between the dummy pixel region DPR and the active pixel region APR in which the active pixel AP, to which a ground voltage is applied, is located.

In example embodiments, the dummy isolation structure DIS is located in a portion of the dummy pixel region DPR, such as in the first dummy pixel region DPR1, such that the first dummy pixel region DPR1 may be effectively insulated. In example embodiments, by adjusting a layout of some regions, isolation between the dummy pixel region DPR and the active pixel region APR may be improved without additional process. Accordingly, the image sensor with improved electrical characteristics may be provided.

In example embodiment, the dummy isolation structure DIS may be provided in each of the dummy pixels DP in the first dummy pixel region DPR1. In example embodiments, the dummy isolation structure DIS may be provided in some of the dummy pixels DP in the first dummy pixel region DPR1.

In example embodiments, the photoelectric conversion element PD may be located in the substrate 100 of each of the active pixels AP. In example embodiments, the photoelectric conversion element PD may be spaced apart from the first surface 100*a* of the substrate 100. The photoelectric conversion element PD may be an n-type impurity doped region. The well region 107 may be located in the substrate 100 of the active pixels AP. The well region 107 may be located adjacent to the first surface 100*a* of the substrate 100. The well region 107 may be a p-type impurity doped region.

In example embodiments, an isolation layer 105 may be located adjacent to the first surface 100*a* of the substrate 100 and configured to reduce electrical conductivity between a first active part ACT1 and a second active part ACT2. The isolation layer 105 may be located in the well region 107. The first active part ACT1 and the second active part ACT2 may be located in each of the active pixels AP. The first active part ACT1 and the second active part ACT2 may be portions of the well region 107. The first active part ACT1 and the second active part ACT2 may be spaced apart from each other in each of the active pixels AP and/or may have different sizes. In example embodiments, referring to FIG. 5A, the second active part ACT2 may be located between the first active parts ACT1, in adjacent active pixels AP.

In example embodiments, a transfer gate TG is located on the first active part ACT1 in each active pixel AP, and a floating diffusion region FD is located in the first active part ACT1 in each active pixel AP in example embodiments, the floating diffusion region FD is located adjacent to the first surface 100*a* of the substrate 100. In example embodiments, the floating diffusion region FD is a region doped with an impurity of conductivity type opposite to that of the impurity doped in the well region 107. In example embodiments, the floating diffusion region FD may be an n-type impurity doped region. In example embodiments, the transfer gate TG may be located on the first surface 100*a* of the substrate 100, and/or adjacent to the floating diffusion region FD.

Logic transistors may be located in the second active parts ACT2 in the active pixels AP. The logic transistors may include at least one of the reset transistor (see RX of FIG. 2A), the source follower transistor (see DX of FIG. 2A), and the selection transistor (see SX of FIG. 2A). The adjacent two active pixels AP may share the logic transistors.

A wiring structure 110 may be located on the first surface 100*a* of the substrate 100. The wiring structure 110 may include at least one of the logic transistor, and wirings 113 and contact plugs 115 connected to the logic transistors. Interlayer insulation layers 111*a*, 111*b*, and/or 111*c* may be stacked on the first surface 100*a* of the substrate 100. The interlayer insulation layers 111*a*, 111*b*, and/or 111*c* may cover the transfer gate TG. A plurality of contact plugs 115 and/or a plurality of wirings 113 may be located in the interlayer insulation layers 111*a*, 111*b*, and 111*c*. The logic transistors may be electrically connected to the floating diffusion region FD through the contact plugs 115.

Color filters CF and microlenses 150 may be located on the second surface 100*b* of the substrate 100. An antireflection layer 132 and first and second upper insulation layers 134 and 136 may be located between the second surface 100*b* of the substrate 100 and the color filters CF. The antireflection layer 132 may prevent reflection of light such that the light incident on the second surface 100*b* of the substrate 100 may smoothly reach the photoelectric conversion element PD. The second upper insulation layer 136 may cover the conductive contact 140.

The color filters CF and microlenses 150 may correspond to each of the active pixels AP. The color filters CF may include a red color filter, a green color filter, or a blue color filter according to the unit pixel. The color filter CF may be arranged two-dimensionally and may include a yellow color filter, magenta filter, and/or a cyanide filter. In example embodiments, the color filters CF may include a white color filter.

The microlens 150 may have a convex shape and/or a predetermined curvature radius. The microlens 150 may include a transparent resin that is configured to concentrate the incident light on each of the active pixels AP.

In example embodiments, the pixel isolation structure PIS and the dummy isolation structure DIS may have a substantially uniform width along a direction. In example embodiments, a width of the pixel isolation structure PIS and/or a width of the dummy isolation structure DIS may be gradually decreased in a direction from the first surface 100*a* of the substrate 100 to the second surface 100*b* of the substrate 100.

A method of manufacturing an image sensor according to example embodiment are described as follows.

The substrate 100 of a first conductivity type (e.g., a p-type) may be provided. The substrate 100 may have the first surface 100*a* and the second surface 100*b* that are opposite to each other. The first surface 100*a* may be a front surface, and the second surface 100*b* may be a back surface. The substrate 100 may have a structure in which a first conductivity type epitaxial layer is located on a first conductivity type bulk silicon substrate. In example embodiments, the substrate 100 may be a bulk semiconductor substrate including a first conductivity type well.

The isolation layer 105 may be located in the substrate 100 of the active pixel region APR adjacent to the first surface 100*a* of the substrate 100 as the first and second active parts ACT1 and ACT2. The isolation layer 105 may be created in the substrate 100 by etching the first surface 100*a* of the substrate 100 to create a shallow trench and depositing an insulating material in the shallow trench.

The pixel isolation structure PIS associated with the active pixel AP and the dummy isolation structure DIS associated with the dummy pixel DP may be created.

The pixel isolation structure PIS and the dummy isolation structure DIS may be created by patterning the first surface 100*a* of the substrate 100 to create a deep trench and filling the deep trench with an insulation material and a conductor. A plurality of the active and dummy pixels AP and DP may be arranged in a matrix form along the first direction D1 and the second direction D2 that are crossing each other.

The photoelectric conversion element PD may be located in the substrate 100 of the active pixel region APR. The photoelectric conversion element PD may be created by doping the substrate 100 with a second conductivity type (e.g., an n-type) impurity different from the first conductivity impurity using a mask having openings corresponding to the respective active pixels AP. Thereafter, the mask may be removed. The well region 107 of first conductivity type may be created before or after the photoelectric conversion element PD is created. The transfer gate TG may be created on the first surface 100*a* of the substrate 100, and the floating diffusion region FD may be created in the substrate 100.

The wiring structure 110 may be created on the first surface 100*a* of the substrate 100. The wiring structure 110 may include the logic transistors, and the wirings 113 and the contact plugs 115 connected to the logic transistors. The interlayer insulation layers 111*a*, 111*b*, and 111*c* may be stacked on the first surface 100*a* of the substrate 100 and may cover the transfer gate TG. A plurality of contact plugs 115 and a plurality of wirings 113 may be located in the interlayer insulation layers 111*a*, 111*b*, and 111*c*.

A thinning process of removing a portion of the substrate 100 may be performed to reduce a vertical thickness of the substrate 100. The thinning process may including grinding or polishing the second surface 100*b* of the substrate 100 and performing isotropic and/or anisotropic etching process. A top and bottom of the substrate 100 may be reversed to make the substrate 100 thin. The portion of the substrate 100 may be removed by the grinding or polishing process, and then the isotropic and/or anisotropic etch process may be performed to remove surface defects of the substrate 100.

As the thinning process is performed on the second surface 100*b* of the substrate 100, surfaces of the pixel isolation structure PIS and the dummy isolation structure DIS may be exposed. Thus, the exposed surfaces of the pixel isolation structure PIS and the dummy isolation structure DIS may be at the same level as the second surface 100*b* of the substrate 100.

The antireflection layer 132, the conductive contact 140, and/or the first and second upper insulation layers 134 and 136 may be located on the second surface 100*b* of the substrate 100. The color filters CF and the microlenses 150 may be located corresponding to the respective active pixel regions APR, on the second upper insulation layer 136.

Figure 6:
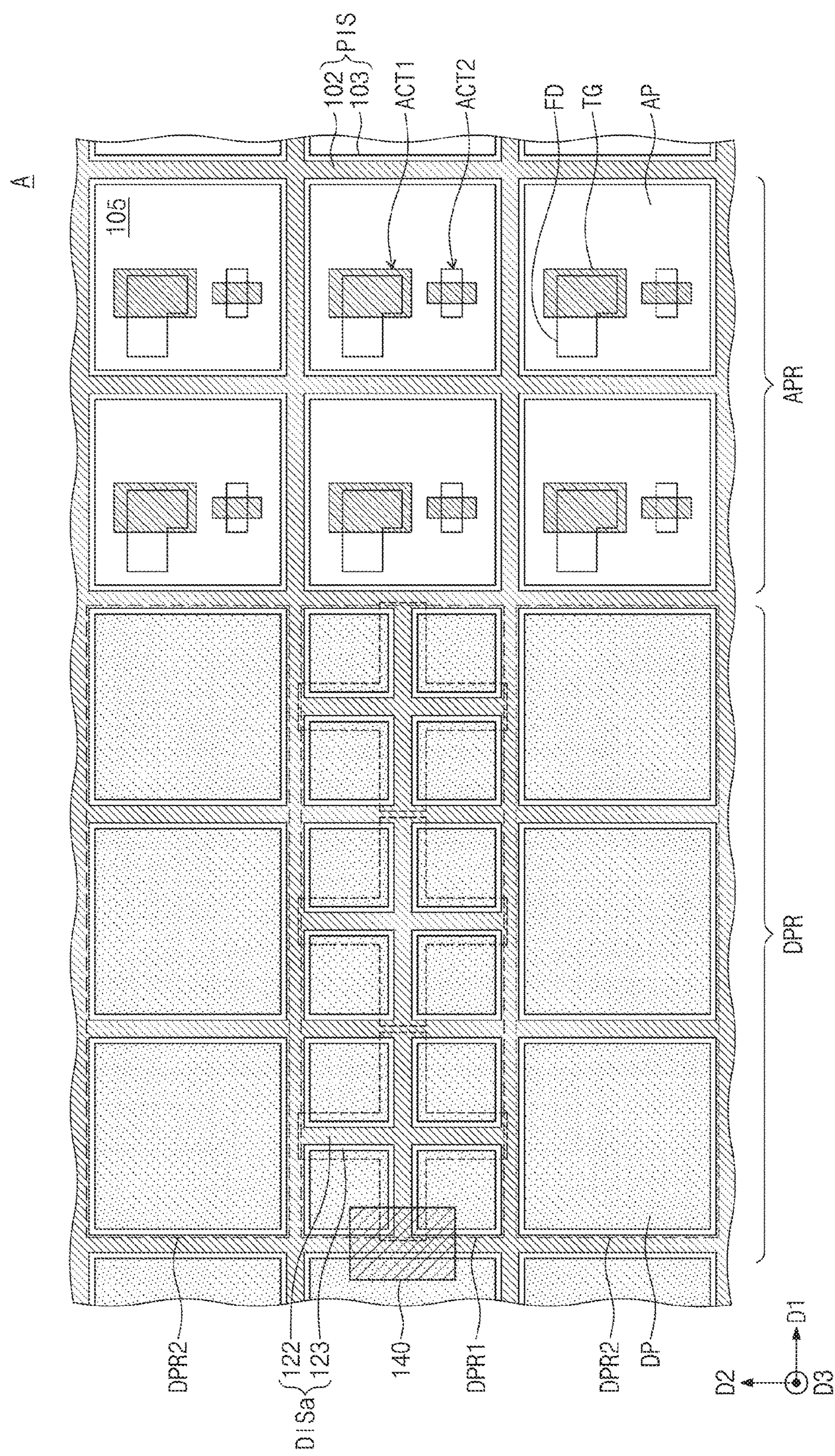
FIG. 6 is a view of an image sensor according to example embodiments.

FIGS. 6 and 7 present a few example embodiments. Whereas the example embodiment of FIG. 5A that includes a dummy isolation structure DIS having a substantially linear shape in plan view, FIG. 6 presents an example embodiment that includes a dummy isolation structure having a substantially cross shape in plan view, and FIG. 7 presents an example embodiment that includes a dummy isolation structure having a substantially block shape in plan view.

FIG. 6 is a view of an image sensor according to example embodiments and is an enlarged view of portion A of FIG. 4. The descriptions of the same elements as described with reference to FIGS. 5A to 5C are briefly made or omitted.

Referring to FIG. 6, an image sensor may include a dummy isolation structure DISa having a substantially cross shape in plan view. In example embodiments, the pixel isolation structure PIS may be denser in the first dummy pixel region DPR1 than in other regions (e.g., the second dummy pixel region DPR2 and the active pixel region APR). In example embodiments, a shape and/or a size of the dummy isolation structure DISa may be variously changed, without limitation to the cross shape.

Figure 7A:
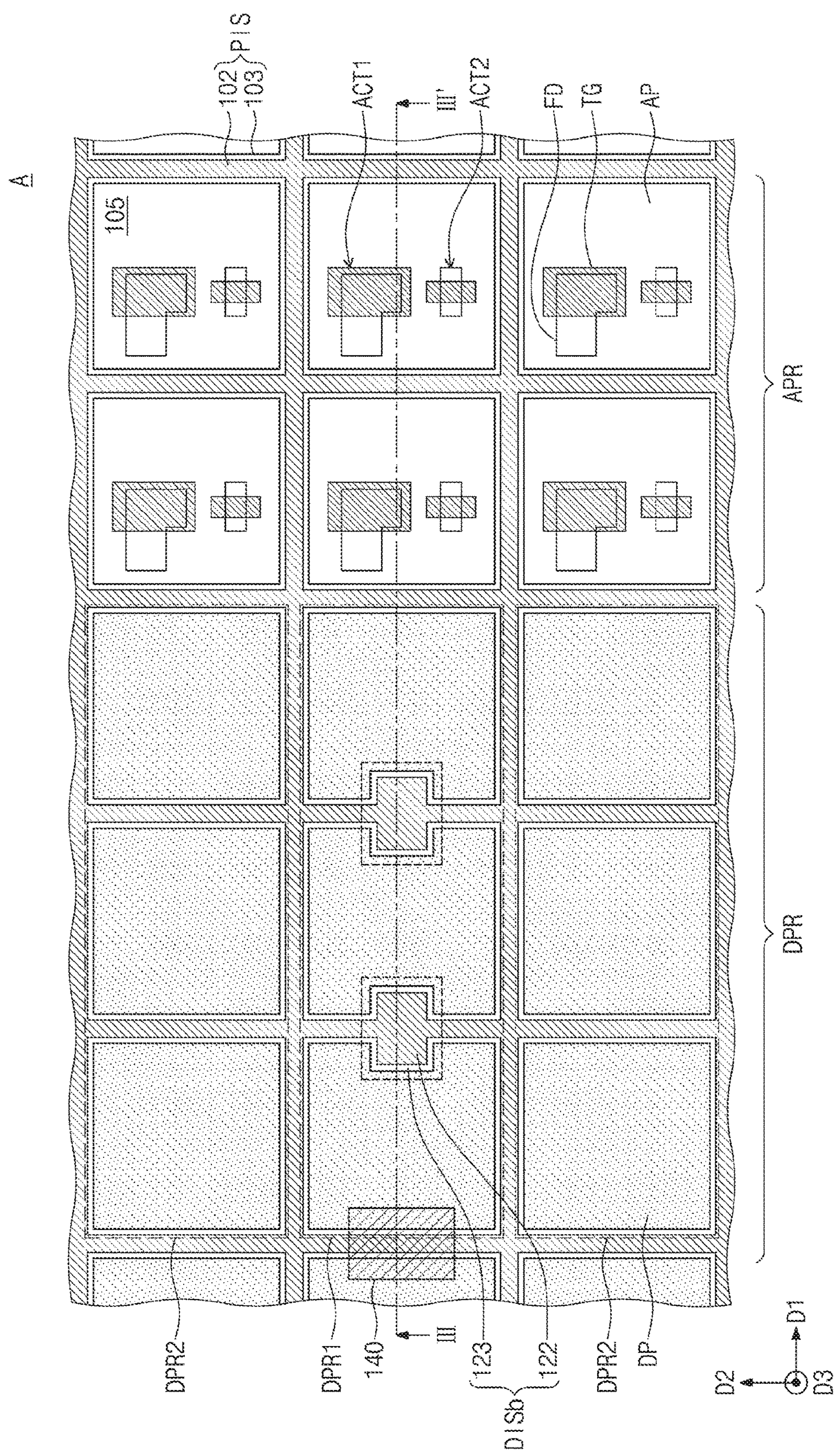
FIG. 7A is a view of an image sensor according to example embodiments.
Figure 7B:
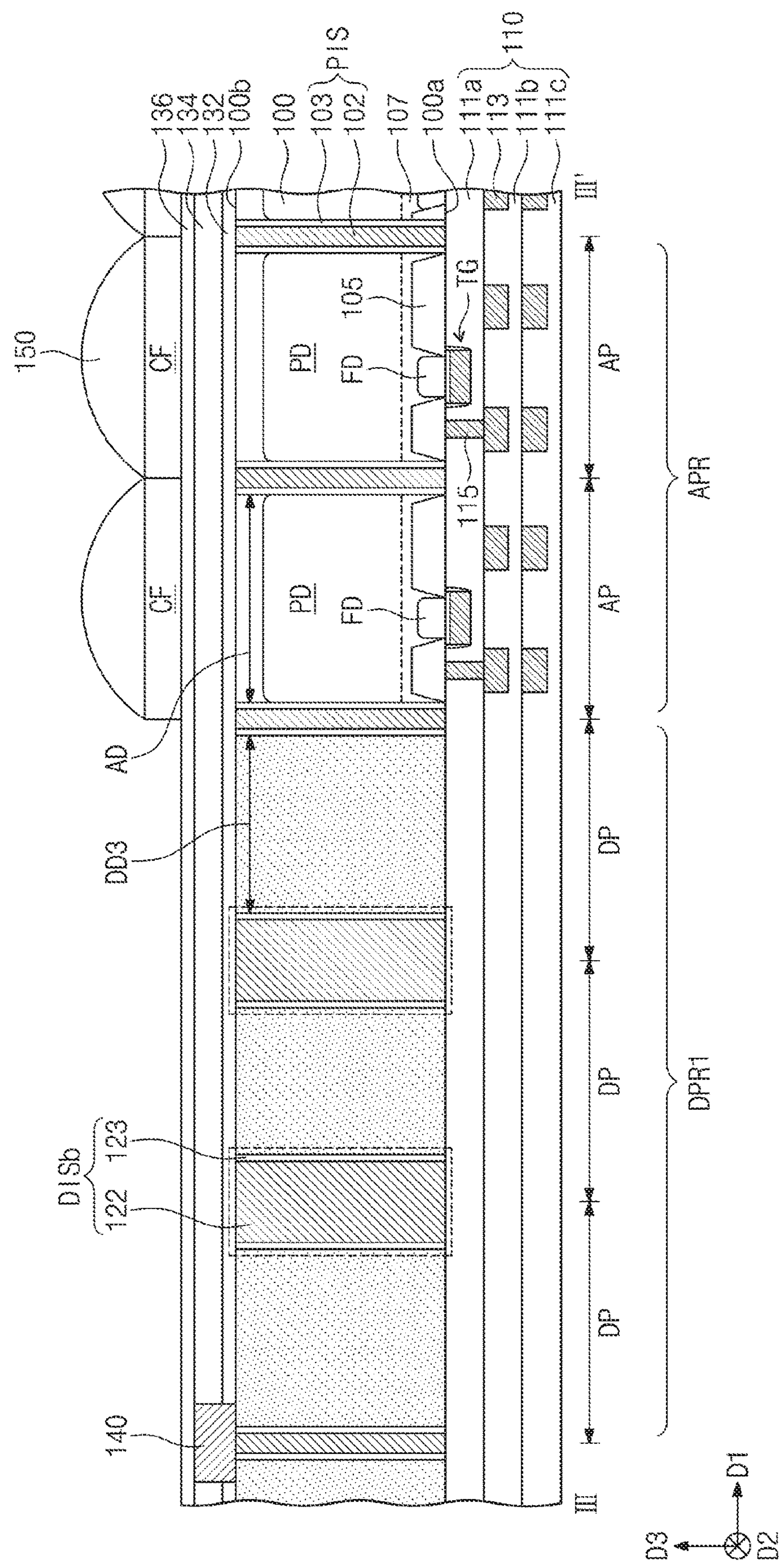
FIG. 7B is a cross-sectional view taken along line III-III' of FIG. 7A.

FIG. 7A is a view of an image sensor according to example embodiments and is an enlarged view of portion A of FIG. 4. FIG. 7B is a cross-sectional view taken along line III-III' of FIG. 7A. The descriptions of the same elements as described with reference to FIGS. 5A to 5C are briefly made or omitted.

Referring to FIG. 7A, an image sensor may include a dummy isolation structure DISb located between adjacent dummy pixels DP in plan view. The dummy isolation structure DISb may be connected to the pixel isolation structure PIS between adjacent dummy pixels DP. In plan view, the dummy isolation structure DISb may present a substantially block shape that is located in a central region of the pixel isolation structure PIS between the adjacent dummy pixels DP. The dummy isolation structure DISb may extend toward the insides of the adjacent dummy pixels DP. At least some of the dummy pixels DP in the first dummy pixel region DPR1 may include a central portion having a narrower width than that of a peripheral portion thereof.

Referring to FIG. 7B, a distance DD3 between the dummy isolation structure DISb and the pixel isolation structure PIS in the first dummy pixel region DPR1 may be smaller than the distance AD between adjacent pixel isolation structures PIS in the active pixel region APR. In other words, the distance DD3 between the pixel isolation structures PIS in the first dummy pixel region DPR1 may be smaller than the distance AD between the adjacent pixel isolation structures PIS in the active pixel region APR.

In example embodiments, as a dummy isolation structure DISb is located in the central region between the adjacent dummy pixels DP in the first dummy pixel region DPR1, a space between the adjacent dummy pixels DP may provide an etch margin between the dummy pixels DP. In other example embodiments, the pixel isolation structure PIS extends from the first surface 100*a* toward the second surface 100*b*, and the etch margin between the adjacent dummy pixels DP is not provided in a region adjacent to the second surface 100*b* of the substrate 100. In example embodiments, the central region between the dummy pixels DP is over-etched compared to the peripheral region of the dummy pixel DP.

Figure 8:
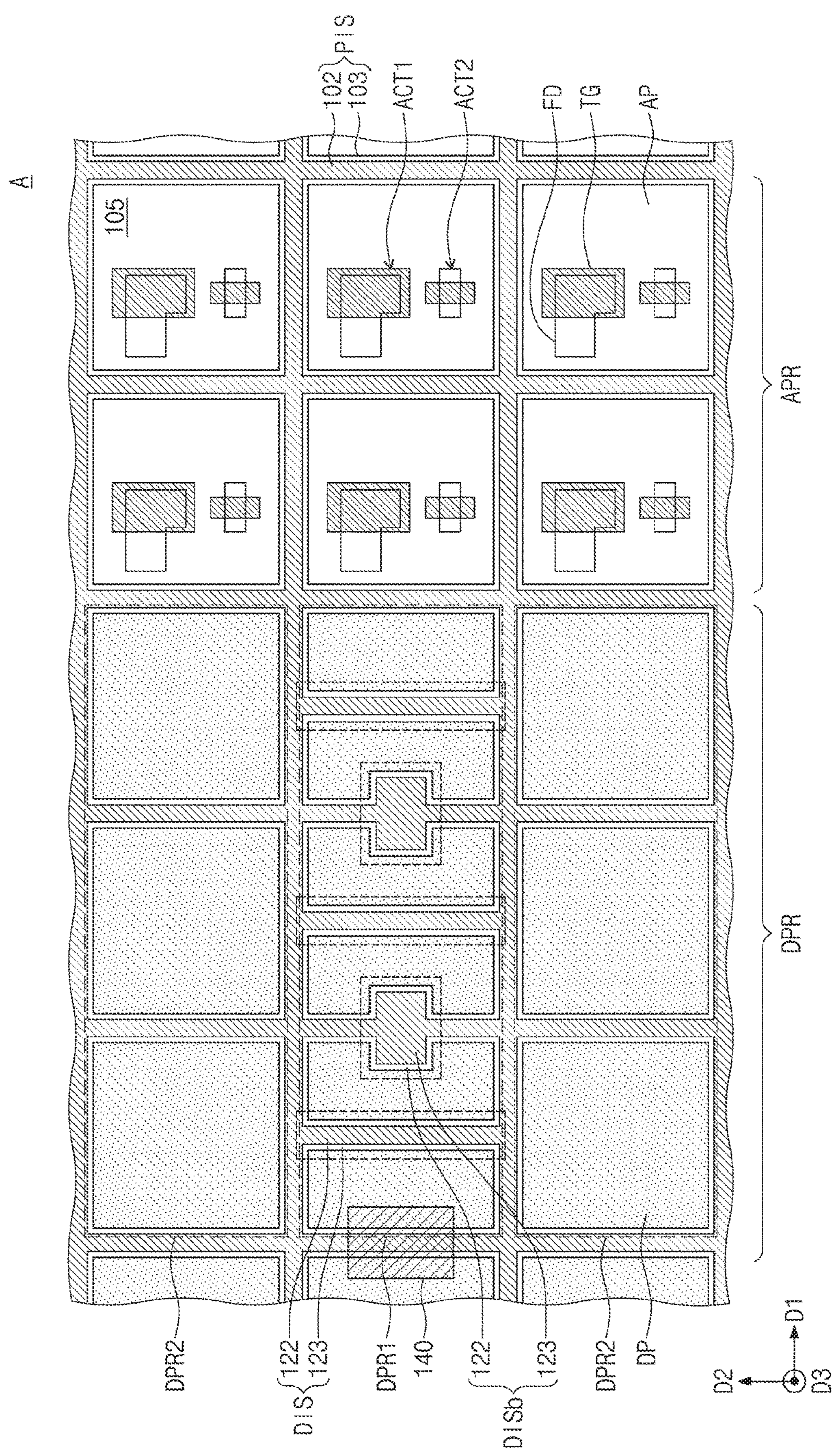
FIG. 8 is a view of an image sensor according to example embodiments.

FIG. 8 is a view of an image sensor according to example embodiments and is an enlarged view of portion A of FIG.

4. The descriptions of the same elements as described with reference to FIGS. 5A to 5C and FIGS. 7A and 7B are briefly made or omitted.

FIG. 8 presents an image sensor including two dummy isolation structures identified as DIS and DISb. The first dummy pixel region DPR1 includes the dummy isolation structure DIS in the dummy pixel DP and the dummy isolation structure DISb between adjacent dummy pixels DP. In example embodiments, the dummy isolation structure DIS may have a linear shape, but the shape and/or a size of the dummy isolation structure DIS may be variously changed.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. An image sensor comprising:

a substrate comprising an active pixel region and a dummy pixel region;

a conductive contact located in the dummy pixel region;

a pixel isolation structure configured to at least partially penetrate the substrate, wherein the pixel isolation structure is configured to provide electrical isolation between an active pixel in the active pixel region and a dummy pixel in the dummy pixel region; and a dummy isolation structure located between the conductive contact and the active pixel region and configured to at least partially penetrate the substrate of the dummy pixel region, wherein at least one dummy pixel in the dummy pixel region is surrounded by the pixel isolation structure, when viewed in plan view, at least one active pixel in the active pixel region is surrounded by the pixel isolation structure, when viewed in plan view, and the dummy isolation structure includes a first conductor and the pixel isolation structure includes a second conductor.

2. The image sensor according to claim 1, wherein the pixel isolation structure includes a first insulation layer that at least partially filling an isolation trench between the active pixel and the dummy pixel.

3. The image sensor according to claim 1, further comprising:

a conductive contact directly connected to the first conductor.

4. The image sensor according to claim 3, wherein the dummy isolation structure is located in the dummy pixel region, in plan view.

5. The image sensor according to claim 1, wherein the dummy isolation structure has at least one of a substantially linear shape, a substantially cross shape, or a substantially block shape, in plan view.

6. The image sensor according to claim 3, wherein the dummy pixel region between the conductive contact and the active pixel region includes at least two adjacent dummy pixels, and wherein the dummy isolation structure is located between the at least two adjacent dummy pixels.

7. The image sensor according to claim 6, wherein the dummy isolation structure is connected to the pixel isolation structure between the adjacent dummy pixels.

8. The image sensor according to claim 1, wherein the pixel isolation structure includes an electrically insulating material, and wherein the dummy isolation structure also includes the electrically insulating material.

9. The image sensor according to claim 3, wherein the pixel isolation structure includes a first insulation layer.

10. The image sensor according to claim 3, wherein the conductive contact is configured to apply a negative voltage to the dummy pixel region.

11. The image sensor according to claim 1, further comprising:

a second dummy isolation structure that includes a second insulation layer; and a second conductor located on the second insulation layer.

12. An image sensor comprising:

an active pixel region including an active pixel surrounded by a pixel isolation structure in plan view;

a first dummy pixel region including a dummy pixel;

a second dummy pixel region;

a conductive contact located in the dummy pixel region; and a dummy isolation structure in the second dummy pixel region that is configured to electrically isolate the dummy pixel and the second dummy pixel region, wherein the dummy isolation structure is located between the conductive contact and the active pixel region, wherein the pixel isolation structure surrounds the dummy pixel in plan view and at least one active pixel in plan view, and the dummy isolation structure includes a first conductor and the pixel isolation structure including a second conductor.

13. The image sensor according to claim 12, further comprising:

a substrate within which the active pixel region and the dummy pixel region are located, wherein the pixel isolation structure is configured to at least partially penetrate the substrate, the pixel isolation structure configured to electrically isolate the active pixel in the active pixel region and the dummy pixel in the first dummy pixel region; and the image sensor further comprises a conductive contact connected to the pixel isolation structure, wherein the second dummy pixel region is between the active pixel and the conductive contact.

14. The image sensor according to claim 13, wherein the dummy isolation structure is configured to at least partially penetrate the substrate.

15. The image sensor according to claim 13, wherein the pixel isolation structure includes an electrically insulating material, and wherein the dummy isolation structure also includes the electrically insulating material.

16. The image sensor according to claim 12, wherein the dummy isolation structure includes an insulation layer.

17. The image sensor according to claim 12, wherein the dummy isolation structure has a substantially linear shape, a substantially cross shape, or a substantially block shape, in plan view.

18. An image sensor comprising:

a substrate including at least two pixel regions including an active pixel region having at least one active pixel and a dummy pixel region having at least one dummy pixel;

a dummy isolation structure in the substrate;

a pixel isolation structure in the substrate that is configured to electrically isolate the at least two pixel regions, the pixel isolation structure having a lattice shape, the pixel isolation structure surrounding the at least one active pixel and at least one dummy pixel in plan view, wherein the dummy pixel region includes a first dummy pixel region and a second dummy pixel region, wherein a distance between first adjacent portions of the pixel isolation structure in the first dummy pixel region is less than a distance between second adjacent portions of the pixel isolation structure in the active pixel region, wherein a distance between third adjacent portions of the pixel isolation structure in the second dummy pixel region is the same as the distance between the second adjacent portions of the pixel isolation structure in the active pixel region, and the dummy isolation structure includes a first conductor and the pixel isolation structure includes a second conductor.

19. The image sensor according to claim 18, further comprising a conductive contact connected to at least a portion of the dummy pixel region, wherein the first dummy pixel region is between the conductive contact and the active pixel region.

20. The image sensor according to claim 18, wherein the pixel isolation structure is configured to at least partially penetrate the substrate.

* * * * *